US010510856B2

(12) United States Patent
Hsieh et al.

(10) Patent No.: US 10,510,856 B2
(45) Date of Patent: Dec. 17, 2019

(54) SEMICONDUCTOR DEVICE AND METHOD (71) Applicant: Taiwan Semiconductor Manufacturing Company, Ltd., Hsinchu (TW)

(72) Inventors: Ming-Ta Hsieh, Zhubei (TW); Tetsu Ohtou, Hsinchu (TW); Ching-Wei Tsai, Hsinchu (TW); Chih-Hao Wang, Baoshan Township (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 15/871,646

(22) Filed: Jan. 15, 2018

(65) Prior Publication Data

US 2018/0151682 A1 May 31, 2018

Related U.S. Application Data (63) Continuation of application No. 14/490,574, filed on Sep. 18, 2014, now Pat. No. 9,871,111.

(51) Int. Cl.
| | |
|---|---|
| *H01L 29/423* | (2006.01) |
| *B82Y 10/00* | (2011.01) |
| *H01L 29/40* | (2006.01) |
| *H01L 29/66* | (2006.01) |
| *H01L 29/06* | (2006.01) |
| *H01L 29/08* | (2006.01) |
| *H01L 29/775* | (2006.01) |
| *H01L 21/8234* | (2006.01) |
| *H01L 27/088* | (2006.01) |

(Continued)

(52) U.S. Cl.
CPC ........ *H01L 29/42392* (2013.01); *B82Y 10/00* (2013.01); *H01L 21/823475* (2013.01); *H01L 21/823487* (2013.01); *H01L 27/088* (2013.01); *H01L 29/0676* (2013.01); *H01L 29/0692* (2013.01); *H01L 29/0847* (2013.01); *H01L 29/1037* (2013.01); *H01L 29/401* (2013.01); *H01L 29/41741* (2013.01); *H01L 29/66439* (2013.01); *H01L 29/775* (2013.01)

(58) Field of Classification Search
CPC ......... H01L 21/76877; H01L 29/42392; H01L 29/66439; H01L 29/0676
See application file for complete search history.

(56) References Cited

U.S. PATENT DOCUMENTS 8,564,034 B2 * 10/2013 Masuoka .......... H01L 27/14616
250/208.1
2006/0006444 A1  1/2006 Leslie
(Continued)

FOREIGN PATENT DOCUMENTS

| CN | 101399207 A | 4/2009 |
|---|---|---|
| EP | 2323166 A1 | 5/2011 |

(Continued)

*Primary Examiner* — Frederick B Hargrove
(74) *Attorney, Agent, or Firm* — Slater Matsil, LLP (57) ABSTRACT

A vertical gate all around (VGAA) is provided. In embodiments, the VGAA has a nanowire with a first contact pad and a second contact pad. A gate electrode is utilized to help define a channel region within the nanowire. In additional embodiments multiple nanowires, multiple bottom contacts, multiple top contacts, and multiple gate contacts are utilized.

20 Claims, 10 Drawing Sheets

(51) Int. Cl.
*H01L 29/10* (2006.01)
*H01L 29/417* (2006.01)

(56) References Cited

U.S. PATENT DOCUMENTS

| | | |
|---|---|---|
| 2007/0222074 A1 | 9/2007 | Bakkers et al. |
| 2008/0067607 A1 | 3/2008 | Verhulst et al. |
| 2008/0173936 A1 | 7/2008 | Yoon et al. |
| 2008/0224122 A1 | 9/2008 | Salton et al. |
| 2010/0207201 A1* | 8/2010 | Masuoka ............ H01L 27/0207 257/329 |
| 2011/0012085 A1* | 1/2011 | Deligianni ............. B82Y 10/00 257/9 |
| 2011/0115011 A1 | 5/2011 | Masuoka et al. |
| 2011/0303973 A1* | 12/2011 | Masuoka .......... H01L 21/26586 257/329 |
| 2011/0303985 A1* | 12/2011 | Masuoka ................ H01L 21/84 257/369 |
| 2012/0187376 A1 | 7/2012 | Tomioka et al. |
| 2013/0240983 A1* | 9/2013 | Larrieu ................. B82Y 10/00 257/329 |
| 2013/0270508 A1* | 10/2013 | Li ....................... H01L 45/1206 257/4 |
| 2014/0008606 A1 | 1/2014 | Hussain et al. |
| 2014/0030859 A1* | 1/2014 | Xie ................. H01L 21/823814 438/199 |
| 2014/0091372 A1 | 4/2014 | Masuoka et al. |

FOREIGN PATENT DOCUMENTS

| | | |
|---|---|---|
| JP | 2008500719 A | 1/2008 |
| JP | 2008103702 A | 5/2008 |
| JP | 5132934 B2 | 1/2013 |

\* cited by examiner

SEMICONDUCTOR DEVICE AND METHOD

PRIORITY CLAIM AND CROSS-REFERENCE

This application is a continuation of U.S. patent application Ser. No. 14/490,574, entitled "Semiconductor Device and Method," filed on Sep. 18, 2014, which application is incorporated herein by reference.

BACKGROUND

As the semiconductor industry has progressed into nanometer technology nodes in pursuit of higher device density, higher performance, and lower costs, challenges from both fabrication and design issues have resulted in the development of three-dimensional designs, such as a vertical gate all around (VGAA) transistor. A typical GAA transistor enables enhanced control of the charge carriers along the lengthwise direction through a complete encirclement of the channel region of a semiconductor nanowire by a gate dielectric and a gate electrode. The GAA transistor has a reduced short channel effect, because the channel region may be surrounded by the gate electrode so that an effect of the source/drain region on an electric field of the channel region may be reduced.

However, there are challenges to implementation of a VGAA. For example, the processes and methods utilized in complementary metal-oxide-semiconductor (CMOS) fabrication are not specifically tailored for the manufacture of VGAA transistors. As such, improvements are needed in the manufacturing processes in order to manufacture VGAA transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-3D illustrate embodiments that utilize multiple nanowires in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
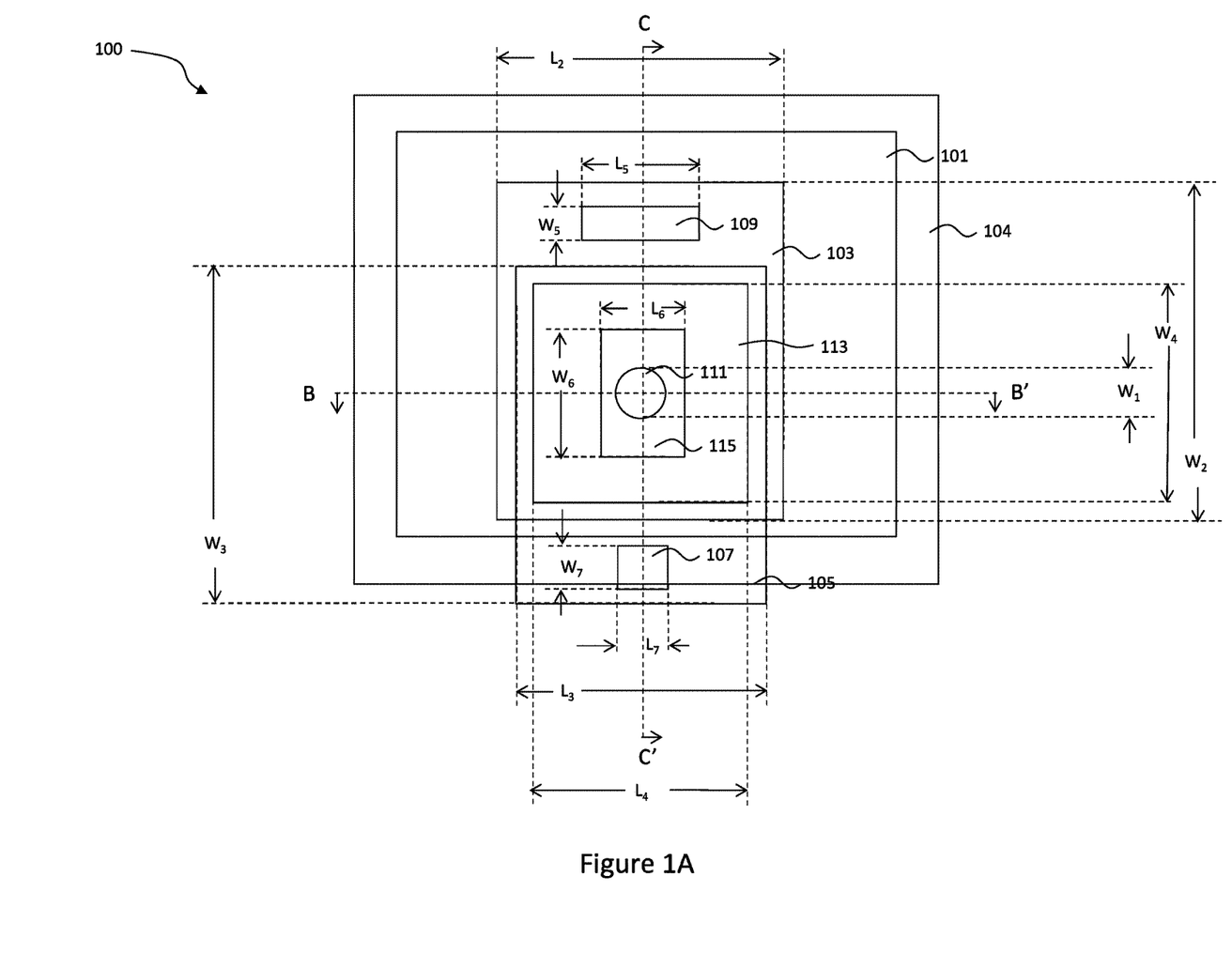
FIGS. 1A-1C illustrate a vertical gate all around transistor in accordance with some embodiments.
Figure 1B:
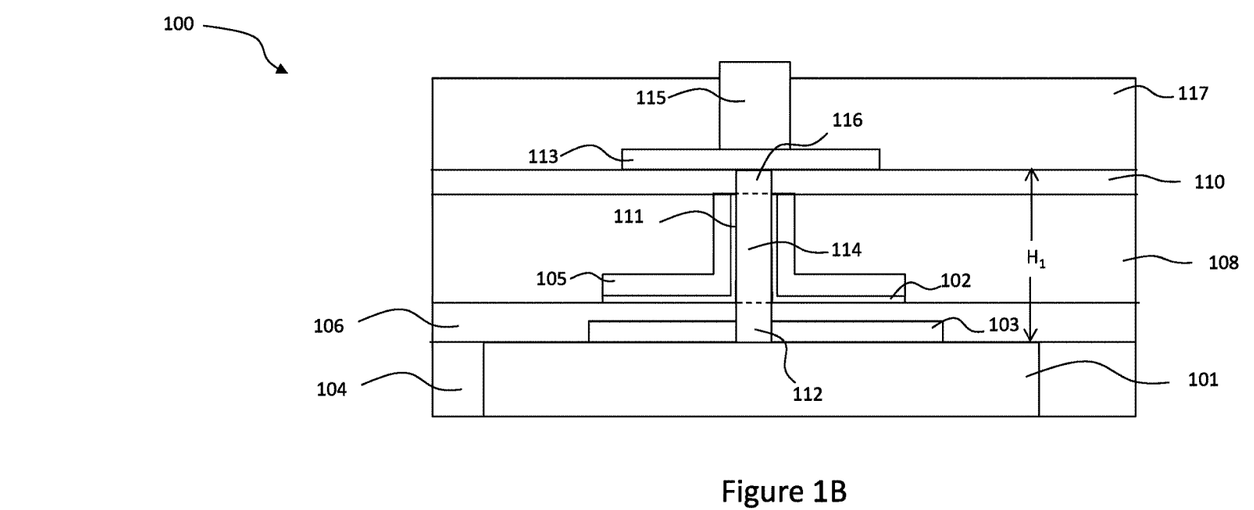
Figure 1C:
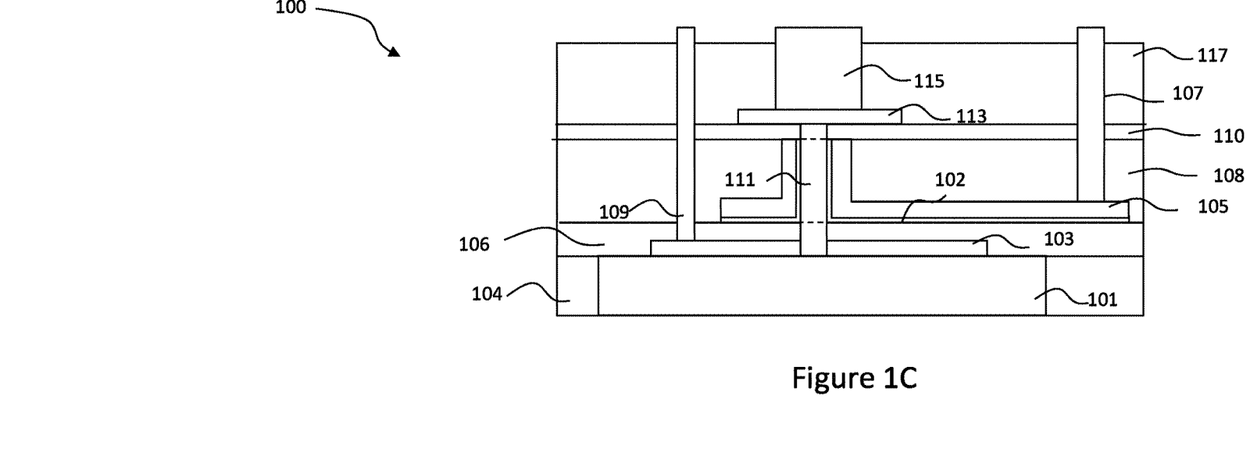

With reference now to FIGS. 1A-1C (with FIG. 1B being a cross-sectional view of FIG. 1A through line B-B' and FIG. 1C being a cross-sectional view of FIG. 1A through line C-C'), there is illustrated a vertical gate all around (VGAA) transistor 100 with a substrate 101 with a first nanowire 111, a first contact pad 103, a gate dielectric 102, a gate electrode 105, a second contact pad 113, a first bottom contact 109, a first top contact 115, and a first gate contact 107. In an embodiment the substrate 101 comprises a semiconductor substrate (e.g., Si, SiGe, or SiGeB). In alternative embodiments, the substrate 101 comprises a silicon-on-insulator (SOI) structure. In some embodiments, the substrate 101 may comprise a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; or combinations thereof.

In some embodiments, the substrate 101 may comprise various doped regions (not individually illustrated) depending on design requirements (e.g., p-type substrate or n-type substrate). For example, the doped regions may be doped with p-type dopants, such as boron or $BF_2$; n-type dopants, such as phosphorus or arsenic; and/or combinations thereof. The doped regions may be configured for an n-type GAA transistor, or alternatively configured for a p-type GAA transistor. In some embodiments, the substrate 101 may include trench isolation regions 104 to isolate the various doped regions.

To help isolate the various doped region, trench isolation regions 104 may be formed. In an embodiment the trench isolation regions may be formed by initially applying a first photo-sensitive layer (not illustrated in FIGS. 1A-1C) is formed on the substrate 101 and is then patterned, forming openings in the first photo-sensitive layer. In some embodiments, the lithography processes include forming the first photo-sensitive layer by spin-on coating, exposing the first photo-sensitive layer using an exposure energy, such as ultraviolet (UV) light, and developing the exposed first photo-sensitive layer to form a patterned first photo-sensitive layer (with the openings) using a developer. In another example, the lithography process includes spin-on coating, soft baking, exposing, post-exposure baking, developing and hard baking. Alternatively, the lithography process to form the patterned first photoresist layer may alternatively use other techniques, such as e-beam lithography, maskless patterning or molecular printing.

Once the first photo-sensitive layer has been formed, the exposed substrate 101 is etched through the first photo-sensitive layer to form trenches (not separately illustrated in FIGS. 1A-1C) within the substrate 101. The first photo-sensitive layer is then removed. Next, a cleaning may be performed to remove a native oxide of the substrate 101. The cleaning may be performed using diluted hydrofluoric (DHF) acid.

The trenches may then be filled with a dielectric material, followed by a chemical mechanical polish (CMP) to form the trench isolation regions 104. The dielectric material may include silicon oxide. In some embodiments, other dielectric materials, such as silicon nitride, silicon oxynitride, fluoride-doped silicate glass (FSG), or a low-K dielectric material, may also be used. In an embodiment, the dielectric material may be formed using a high-density-plasma (HDP) CVD process, using silane ($SiH_4$) and oxygen ($O_2$) as reacting precursors. In other embodiment, the dielectric material may be formed using a sub-atmospheric CVD (SACVD) process or high aspect-ratio process (HARP), wherein process gases may comprise tetraethylorthosilicate (TEOS) and ozone ($O_3$). In yet other embodiment, the dielectric material may be formed using a spin-on-dielectric (SOD) process, such as hydrogen silsesquioxane (HSQ) or methyl silsesquioxane (MSQ).

After formation of the trench isolation regions 104, a second photo-sensitive layer (also not illustrated in FIGS. 1A-1C) is formed on the substrate 101 and is then patterned, forming openings in the second photo-sensitive layer to expose the substrate 101 and define areas for the formation of the first nanowire 111 from the substrate 101. In an embodiment the exposed substrate 101 is etched to form the first nanowire 111 from the substrate 101. The first nanowire 111 may be formed to have a first width $W_1$ of between about 1 nanometer and about 100 nanometers, such as about 10 nanometers, and a first height $H_1$ of between about 1 nanometer and about 1 micrometer, such as about 70 nanometers.

Once the first nanowire 111 has been formed, the second photo-sensitive layer is removed using a process such as ashing, whereby the temperature of the second photo-sensitive layer is increased until the second photo-sensitive layer thermally decomposes. Next, a cleaning may be performed to remove a native oxide of the substrate 101. The cleaning may be performed using diluted hydrofluoric (DHF) acid.

In some embodiments, a first source/drain region 112 (indicated in FIGS. 1B and 1C with a dashed line within the first nanowire 111) is formed by a first ion implantation process in the bottom portion of the first nanowire 111. In some embodiments, a metal silicide may be formed on the source region 212 (not shown).

The first source/drain region 112 includes an n-type dopant (such as phosphorous) when the GAA transistor is n-type or a p-type dopant (such as boron) when the GAA transistor is p-type. In some embodiments, the first source/drain region 112 formed by the ion implantation is further annealed for activation by an annealing process. The annealing process may be implemented right after the ion implantation but alternatively may be implemented after the formation of other doped features for collective activation. In one embodiment, the annealing process includes rapid thermal annealing (RTA). In other embodiments, the annealing process alternatively includes laser annealing, spike annealing, millisecond anneal (MSA) or other suitable annealing technique.

Once the first source/drain region 112 has been formed, the first contact pad 103 is formed to provide electrical connection to the first source/drain region 112. In an embodiment the first contact pad 103 is formed of a conductive material such as aluminum, although other suitable materials, such as copper, tungsten, or the like, may alternatively be utilized. The first contact pad 103 may be formed using a process such as CVD or PVD, although other suitable materials and methods may alternatively be utilized. Once the material for the first contact pad 103 has been deposited, the material may be shaped into the first contact pad 103 using, e.g., one or more photolithographic masking and etching processes. Looking at FIG. 1A, in an embodiment the first contact pad 103 is formed with a second width $W_2$ of between about 20 nanometers and about 20 micrometers, such as about 485 nanometers, and a second length $L_2$ of between about 9 nanometers and about 20 micrometers, such as about 360 nanometers.

Once the first contact pad 105 has been formed, a first isolation region 106 is formed to isolate the substrate 101 and the subsequently formed gate electrode 105. In an embodiment the first isolation region 106 is formed over the first contact pad 103 and the substrate 101 and provides isolation function to and properly configures various features of the GAA transistor. In an embodiment the first isolation region 106 includes a dielectric material, such as silicon oxide. The first isolation region 106 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using chemical vapor deposition (CVD), physical vapor deposition (PVD), or spin-on process, performing a CMP process to remove a portion of the dielectric material above the first nanowire 111, and etching back the dielectric material to the desired height to help define the first source/drain region 112.

Once the first isolation region 106 has been formed, the gate dielectric 102 and the gate electrode 105 surrounding a channel region 114 of the first nanowire 111 are formed. In an embodiment the gate electrode 105 is formed to surround the channel region 114 of the first nanowire 111 as well as to extend outwardly from the first nanowire 111 in order to allow for contact with the first gate contact 107.

In some embodiments, the gate dielectric 102 may include silicon oxide, silicon nitride, silicon oxynitride, or high-k dielectrics, such as metal oxides. Examples of metal oxides that may be used as high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric 102 is a high-k dielectric layer with a thickness in the range of about 5 to 30 angstroms. The gate dielectric 102 may be formed using a suitable process such as atomic layer deposition (ALD), chemical vapor deposition (CVD), physical vapor deposition (PVD), thermal oxidation, UV-ozone oxidation, or combinations thereof. The gate dielectric 102 may further comprise an interfacial layer (not shown) to reduce damage between the gate dielectric 102 and the channel region 114 of the first nanowire 111. The interfacial layer may comprise silicon oxide.

Once the gate dielectric 102 has been formed, the gate electrode 105 may be formed. In an embodiment the gate electrode 105 may be formed by initially forming a layer of metal (not separately illustrated in FIGS. 1A-1C) over the gate dielectric 102. In some embodiments, the layer of metal may comprise a single layer or a multilayer structure. In the present embodiment, the layer of metal may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer comprises a uniform thickness in the range of about 1 nanometer to about 20 nanometers. The layer of metal may be formed using a suitable process such as ALD, CVD, PVD, plating, or combinations thereof.

Once the layer of metal has been formed, the layer of metal may be patterned to separate the gate electrode 105 illustrated in FIGS. 1A-1C from other gate electrodes also formed from the layer of metal (not separately illustrated in FIGS. 1A-1C) by being selectively etched. In an embodiment the layer of metal may be patterned to form the gate electrode 105 by initially applying a third photo-sensitive layer (not separately illustrated in FIGS. 1A-1C) and then patterning the third photo-sensitive layer to expose a portion of the layer of metal that is desired to be removed and to cover a portion of the layer of metal that is desired to remain.

After patterning the third photo-sensitive layer to expose the layer of metal, the layer of metal is etched using the third photo-sensitive layer as a mask. In some embodiments, partially removing the exposed portion of the layer of metal is performed using a dry etch process at a temperature of about 10° C. to about 50° C., under a bias power of about 100 W to about 1000 W and a pressure of about 1 mTorr to about 40 mTorr, using $Cl_2$, HBr, $BCl_3$, $NF_3$, $N_2$, $CF_4$ and $CH_2F_2$ as an etching gas. Once the layer of metal has been patterned, the third photo-sensitive layer is removed using a process such as, e.g., ashing.

Once the layer of metal has been patterned to separate the gate electrode 105 from other gate electrodes, the layer of metal may also be patterned to define the channel region 114 of the first nanowire 111. In an embodiment the layer of metal may be patterned in this direction by initially forming a second isolation region 108 over the layer of metal. In an embodiment the second isolation region 108 includes a dielectric material, such as silicon oxide in the present example. The second isolation region 108 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using CVD, PVD, or spin-on process, performing a CMP process to remove a portion of the dielectric material above the first nanowire 111, and etching back the dielectric material to a desired height to help define the channel region 114.

Once the second isolation feature 108 has been formed to help define the channel region 114, the second isolation region 108 may be used as a mask to help remove exposed portions of the layer of metal from over the first nanowire 111 and form the gate electrode 105 surrounding the channel region 114 of the first nanowire 111. In some embodiments, partially removing the exposed portion of the remaining layer of metal is performed using a dry etch process at a temperature of about 10° C. to about 50° C., under a bias power of about 100 W to about 1000 W and a pressure of about 1 mTorr to about 40 mTorr, using $Cl_2$, HBr, $BCl_3$, $NF_3$, $N_2$, $CF_4$ and $CH_2F_2$ as an etching gas. In an embodiment the gate electrode 105 may be formed to have a third width $W_3$ of between about 20 nanometers and about 20 micrometers, such as about 340 nanometers and a third length $L_3$ of between about 9 nanometers and about 20 micrometers, such as about 315 nanometers.

Once the channel region 114 has been defined by the gate electrode 105, a second source/drain region 116 may be formed in a portion of the first nanowire 111 uncovered by the gate electrode 105. In an embodiment, the second source/drain region 116 is formed by a second ion implantation process in the upper portion of the first nanowire 111. The second source/drain region 116 includes an n-type dopant (such as phosphorous) when the GAA transistor is n-type or a p-type dopant (such as boron) when the GAA transistor is p-type. In some embodiments, the second source/drain region 116 formed by the ion implantation is further annealed for activation by an annealing process. The annealing process is implemented after the ion implantation or is alternatively implemented after the formation of other doped features for collective activation. In one embodiment, the annealing process includes rapid thermal annealing (RTA). In other embodiments, the annealing process alternatively includes laser annealing, spike annealing, millisecond anneal (MSA) or other suitable annealing technique.

Once the gate electrode 105 and the second source/drain region 116 have been formed, a third isolation region 110 may be formed to isolate the second source/drain region 116 within the first nanowire 111. In an embodiment the third isolation region 110 includes a dielectric material, such as silicon oxide. The third isolation region 110 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material includes depositing a dielectric material using, e.g., CVD, PVD, or a spin-on process, and then performing a CMP process to remove a portion of the dielectric material above the first nanowire 111.

Once the third isolation region 110 has been formed, the second contact pad 113 may be formed in electrical connection with the first nanowire 111. In an embodiment the second contact pad 113 is formed in order to provide electrical connection between the second source/drain region 116 within the first nanowire 111 and, e.g., the first top contact 115. In an embodiment the second contact pad 113 is formed of a conductive material such as aluminum, although other suitable materials, such as copper, tungsten, or the like, may alternatively be utilized. The second contact pad 113 may be formed using a process such as CVD or PVD, although other suitable materials and methods may alternatively be utilized. Once the material for the second contact pad 113 has been deposited, the material may be shaped into the second contact pad 113 using, e.g., a photolithographic masking and etching process. Looking at FIG. 1A, in an embodiment the second contact pad 113 is formed with a fourth width $W_4$ of between about 9 nanometers and about 20 micrometers, such as about 280 nanometers, and a fourth length $L_4$ of between about 9 nanometers and about 20 micrometers, such as about 260 nanometers.

After the second contact pad 113 has been formed, a fourth isolation region 117 may be formed to help isolate the second contact pad 113. In an embodiment the fourth isolation region 117 includes a dielectric material, such as silicon oxide in the present example. The fourth isolation region 117 may alternatively include other suitable dielectric material, such as silicon nitride, silicon oxynitride, carbon-doped silicon oxide, carbon-doped silicon nitride, or carbon-doped silicon oxynitride. In some embodiments, the forming of the dielectric material layer includes depositing a dielectric material using CVD, PVD, or a spin-on process. If desired, a CMP process may be utilized to planarize the fourth isolation region 117.

Once the VGAA transistor 100 has been formed, the first bottom contact 109, the first gate contact 107, and the first top contact 115 may be formed in order to electrically connect the first source/drain region 112, the second source/drain region 116, and the gate electrode 105. In an embodiment the first bottom contact 109, the first gate contact 107, and the first top contact 115 may be formed either together or separately by initially applying a fifth photo-sensitive material, patterning the fifth photo-sensitive material, and then removing portions of the fourth isolation region 117, the third isolation region 110, the second isolation region 108, and the first isolation region 106 to form openings and to expose portions of the second contact pad 113, the gate electrode 105, and the first contact pad 103.

Looking at FIG. 1A, in an embodiment the first bottom contact 109 may be formed to a fifth width $W_5$ of between about 1 nanometer and about 1 micrometer, such as about 40 nanometers, and a fifth length $L_5$ of between about 1 nanometer and about 20 micrometers, such as about 216 nanometers. Additionally, the first top contact 115 may be formed to a sixth width $W_6$ of between about 1 nanometer and about 20 micrometers, such as about 72 nanometers, and a sixth length $L_6$ of between about 1 nanometer and about 20 micrometers, such as about 26 nanometers. The first gate contact 107 may be formed to a seventh width $W_7$ of between about 1 nanometer and about 20 micrometers, such as about 50 nanometers and a seventh length $L_7$ of between about 1 nanometer and about 20 micrometers, such as about 50 nanometers.

Once the openings have been formed, the openings may be filled with a conductive material. In an embodiment the conductive material may be copper, although any suitable material may be used, and may be formed by initially forming a seed layer within the openings and then using a process such as plating in order to fill or overfill the openings with the conductive material. Once filled, any excess conductive material located outside of the openings may be removed using, e.g., a chemical mechanical polishing process.

By utilizing the first contact pad 103 and the second contact pad 113, the asymmetrical nature of the source/drain regions that can occur in the manufacturing process may be reduced or eliminated. By minimizing the variations between the source/drain regions, a more consistent device with better control may be manufactured.

Figure 2A:
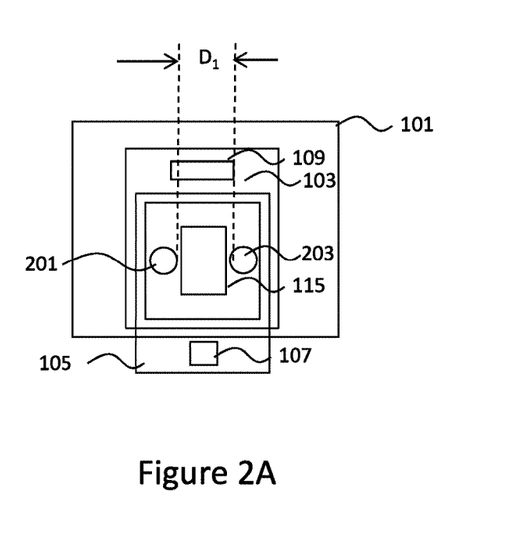

FIGS. 2A-2D illustrate various embodiments which utilize a different number and placement of nanowires (e.g., the first nanowire 111, a second nanowire 201, and a third nanowire 203) in accordance with various embodiments. Looking first at FIG. 2A, FIG. 2A illustrates an embodiment in which, instead of the first nanowire 111, the second nanowire 201 and the third nanowire 203 are utilized. In an embodiment the second nanowire 201 and the third nanowire 203 are utilized within the VGAA transistor 100. In one embodiment the second nanowire 201 and the third nanowire 203 may be formed to similar dimensions and using similar process as the first nanowire 111 (described above with respect to FIGS. 1A-1C). However, the second nanowire 201 and the third nanowire 203 may alternatively be formed to different dimensions or using different process.

In an embodiment the second nanowire 201 and the third nanowire 203 are located such that they are not overlaid by the first top contact 115. For example, and as illustrated in FIG. 2A, the second nanowire 201 and the third nanowire 203 are located on opposing sides of the first top contact 115, and may be separated from each other by a first distance $D_1$ of less than about 20 micrometers, such as about 96 nanometers. However, any suitable distance may alternatively be utilized.

Figure 2B:
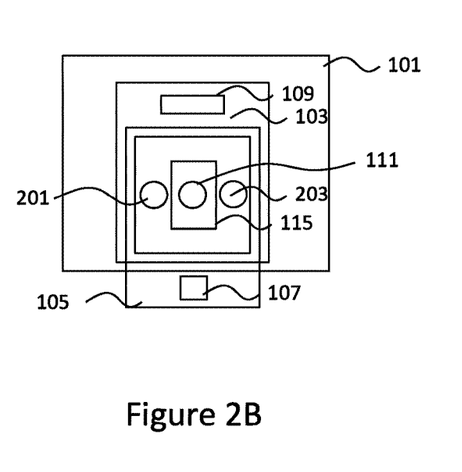

FIG. 2B illustrates another embodiment in which the first nanowire 111 is used in conjunction with the second nanowire 201 and the third nanowire 203. In this embodiment the first nanowire 111 is located beneath the first top contact 115 while the second nanowire 201 and the third nanowire 203 are located as described above with respect to FIG. 2A.

Figure 2C:
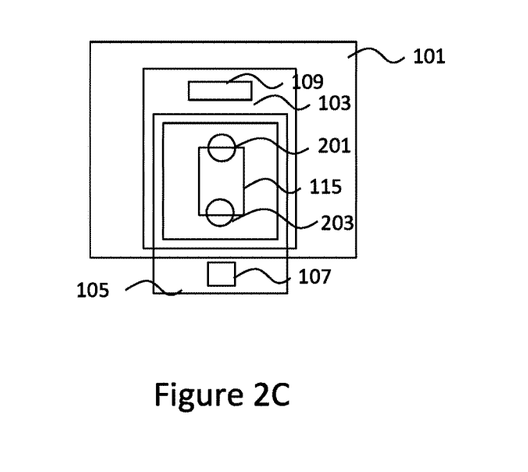

FIG. 2C illustrates another embodiment in which the second nanowire 201 and the third nanowire 203 are formed so as to be located at least partially beneath the first top contact 115. In this embodiment the second nanowire 201 and the third nanowire 203 may be arranged along a line that extends between the first gate contact 107 and the first bottom contact 109 (in the top down view).

Figure 2D:
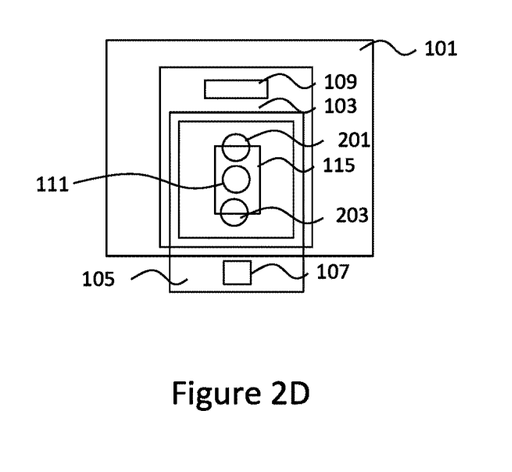

FIG. 2D illustrates another embodiment in which the second nanowire 201 and the third nanowire 203 are arranged as described in FIG. 2C. In this embodiment, however, the first nanowire 111 is additionally included and is located beneath the first top contact 115. As illustrated, the first nanowire 111, the second nanowire 201, and the third nanowire 203 are all in a line with the first gate contact 107 and the first bottom contact 109.

Figure 3A:
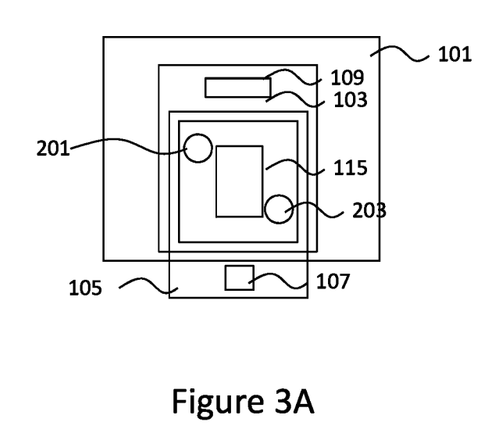

FIGS. 3A-3D illustrate further embodiments in which the first nanowire 111, the second nanowire 201, and the third nanowire 203 are arranged in lines that are not parallel with the borders of the VGAA transistor 100. FIG. 3A illustrates an embodiment in which the positions of the second nanowire 201 and the third nanowire are rotated around the first top contact 115 such that the second nanowire 201 and the third nanowire 203 are at separate distances from the first gate contact 107. In the embodiment illustrated in FIG. 3A, the third nanowire 203 is located closer to the first gate contact 107 than the second nanowire 201.

Figure 3B:
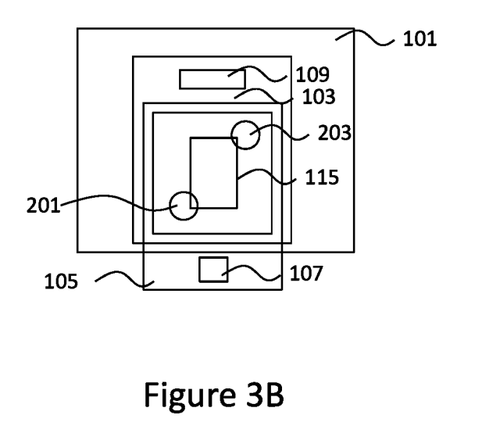

FIG. 3B illustrates another embodiment similar to the embodiment illustrated in FIG. 3A. In this embodiment, however, the locations of the second nanowire 201 and the third nanowire 203 are rotated in an opposite direction than the embodiment discussed above with respect to FIG. 3A. Accordingly, in this embodiment the second nanowire 201 is located closer to the first gate contact 107 than the third nanowire 203.

Figure 3C:
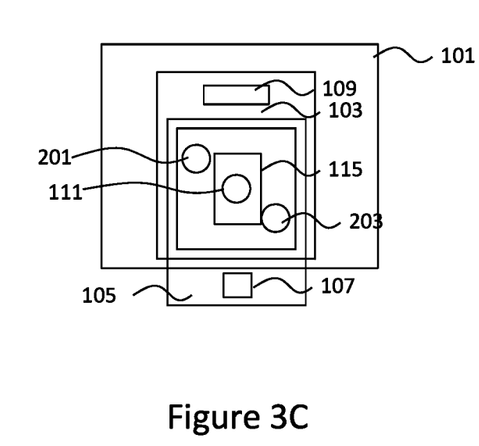
Figure 3D:
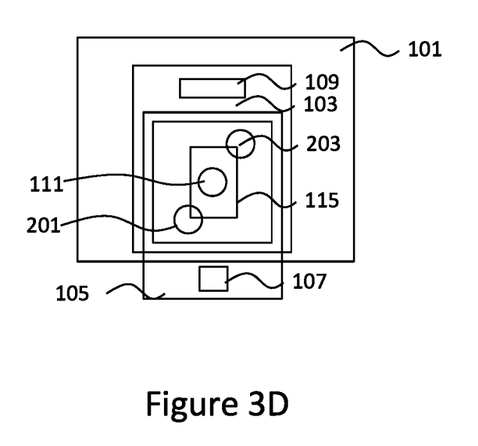

FIGS. 3C and 3D illustrate further embodiments which the positions of the second nanowire 201 and the third nanowire 203 have been rotated as described above with respect to FIGS. 3A and 3B, respectively. In these embodiments, however, the second nanowire 201 and the third nanowire 203 are utilized in conjunction with the first nanowire 111, which is located as centered beneath the first top contact 115 as described above with respect to FIGS. 1A-1C.

Figure 4:
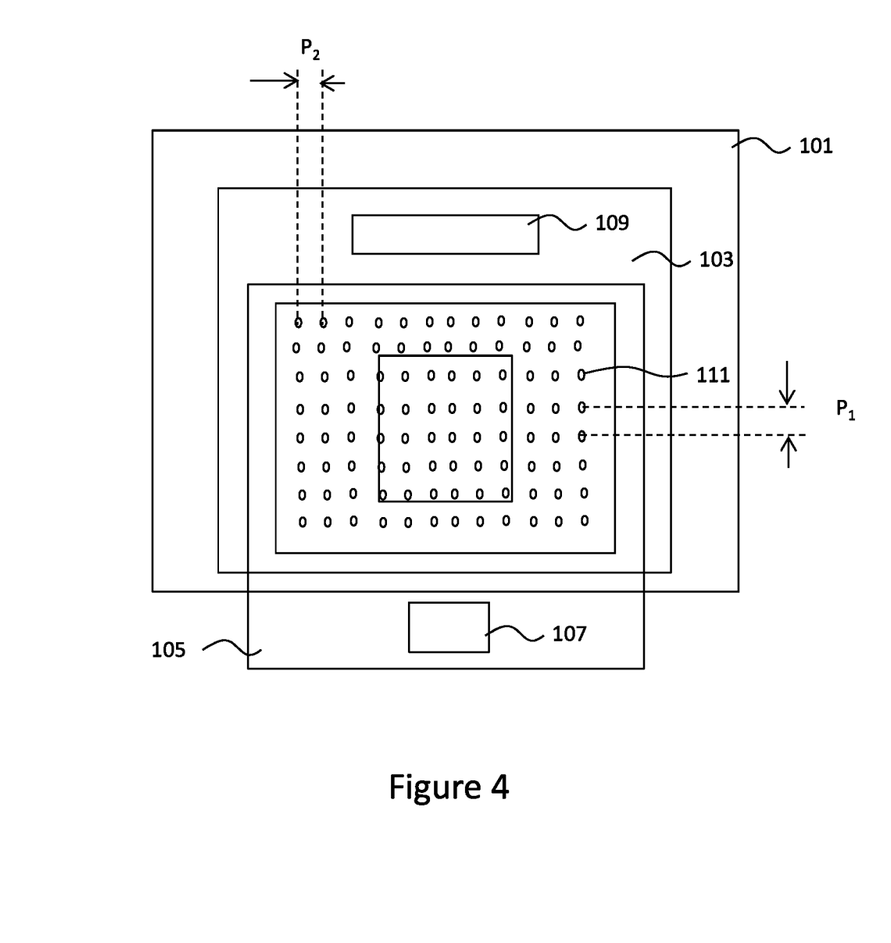
FIGS. 4-5 illustrate embodiments that utilize an array of nanowires in accordance with some embodiments.

FIG. 4 illustrates another embodiment in which an array of nanowires 401 is utilized. In this embodiment, instead of using one, two, or three nanowires (as described above with respect to FIGS. 2A-3D), the array of nanowires 401 may comprise a larger number of nanowires of between about 1 and about 1000000, such as about 96 nanowires. In the embodiment illustrated in FIG. 4, the array of nanowires 401 is arranged such that the individual nanowires are located in evenly spaced rows and columns. In an embodiment there are between about 1 row and about 1000 rows, such as about 12 rows and between about 1 column and about 1000 columns, such as about 8 columns.

In this embodiment the rows and columns may be evenly spaced apart from each other. For example, in an embodiment in which each one individual nanowire within the array of nanowires 401 has a diameter of between about 1 nanometer and about 100 nanometer, such as about 10 nanometer, the individual rows within the array of nanowires 401 may have a first pitch $P_1$ of less than about 20 micrometers, such as about 96 nanometers. Additionally, the individual columns within the array of nanowires 401 may have a second pitch $P_2$ of less than about 20 micrometers, such as about 96 nanometers.

Figure 5:
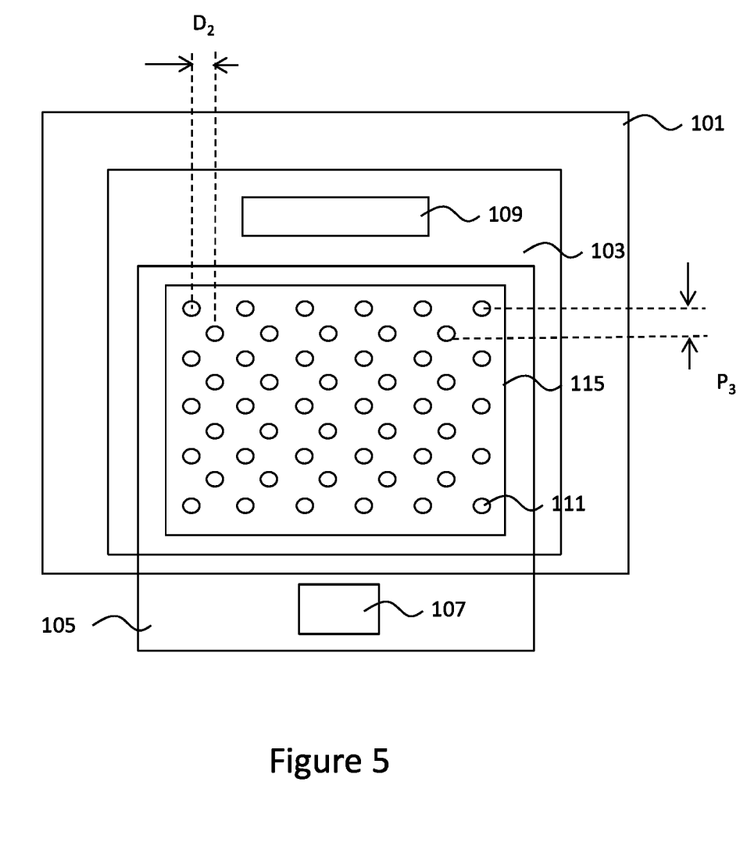

FIG. 5 illustrates another embodiment that utilizes the array of nanowires 401. In this embodiment, however, instead of the plurality of nanowires being in evenly spaced rows and columns, the array of nanowires are arranged in rows and columns that are offset from each other. For example, in an embodiment in which the individual nanowires within the array of nanowires 401 have a diameter of about 10 nanometers, the rows may have a third pitch $P_3$ of less than about 20 micrometers, such as about 96 nanometers. However, adjacent rows may be offset from each other by a second distance $D_2$ of less than about 20 micrometers, such as about 96 nanometers.

By utilizing two or more nanowires, the overall VGAA transistor 100 can handle a larger current with less detrimental effects than the VGAA transistor 100 with only a single nanowire. As such, the VGAA transistor 100 can be utilized for a wide variety of applications. Additionally, by rotating the positions of the second nanowire 201 and the third nanowire 203, the benefits of using multiple nanowires may be achieved while also reducing the area needed for the placement of the multiple nanowires.

Figure 6A:
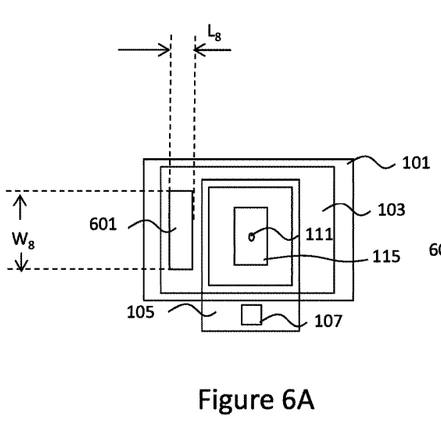
FIGS. 6A-6F illustrate embodiments that utilize one or more bottom contacts in accordance with some embodiments.

FIGS. 6A-6F illustrate further embodiments which utilize one or more bottom contacts (e.g., the first bottom contact 109, a second bottom contact 601, and a third bottom contact 603). Looking first at FIG. 6A, FIG. 6A illustrates the second bottom contact 601, instead of being located in line with the first top contact 115 and the gate electrode 105 as the first bottom contact 109 is in FIGS. 1A-1C, is located along a line that is at a right angle from a line that extends from the first top contact 115 and the first gate contact 107. In this embodiment the second bottom contact 601 may have an eight width $W_8$ of between about 1 nanometer and about 20 micrometers, such as about 240 nanometers, and a eighth length $L_8$ of between about 1 nanometer and about 20 micrometers, such as about 40 nanometers. The second bottom contact 601 may be formed using similar materials and similar processes as the first bottom contact 109 (illustrated and discussed above with respect to FIGS. 1A-1C).

Figure 6B:
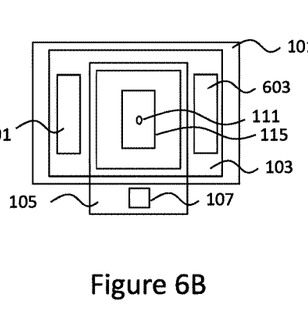

FIG. 6B illustrates another embodiment in which the second bottom contact 601 is utilized in conjunction with the third bottom contact 603. In an embodiment the third bottom contact 603 is similar to the second bottom contact 601, but is located on an opposite side (in the top down view of FIG. 6B) of the first nanowire 111 than the second bottom contact 601.

Figure 6C:
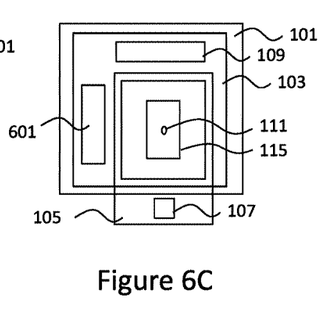

FIG. 6C illustrates an embodiment in which the second bottom contact 601 is utilized in conjunction with the first bottom contact 109 and without the third bottom contact 603. In this embodiment the first bottom contact 109 is located as described above with respect to FIGS. 1A-1C, and the second bottom contact 601 is located as described above with respect to FIG. 6A.

Figure 6D:
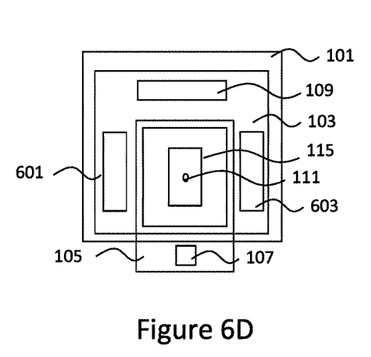

FIG. 6D illustrates an embodiment in which the first bottom contact 109, the second bottom contact 601, and the third bottom contact 603 are all utilized together. In this embodiment the first bottom contact 109 is located as described above with respect to FIGS. 1A-1C, the second bottom contact 601 is located as described above with respect to FIG. 6A, and the third bottom contact 603 is located as described above with respect to FIG. 6B.

Figure 6E:
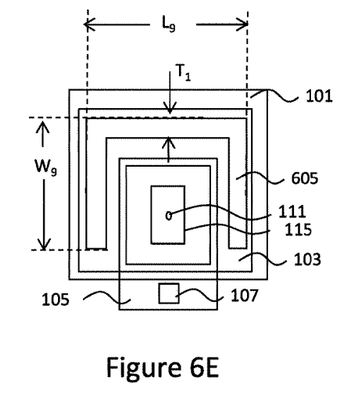

FIG. 6E illustrates an embodiment in which, instead of using the first bottom contact 109, the second bottom contact 601, and the third bottom contact 603 as separate structures, the first bottom contact 109, the second bottom contact 601, and the third bottom contact 603 are merged into a single U-shaped bottom contact 605. In this embodiment the U-shaped bottom contact 605 may have a first thickness $T_1$ of between about 1 nanometer and about 20 micrometers, such as about 40 nanometers. Additionally, the U-shaped bottom contact 605 may have a ninth width $W_9$ of between about 1 nanometer and about 20 micrometers, such as about 240 nanometers, and a ninth length $L_9$ of between about 3 nanometers, and about 20 micrometers, such as about 296 nanometers.

Figure 6F:
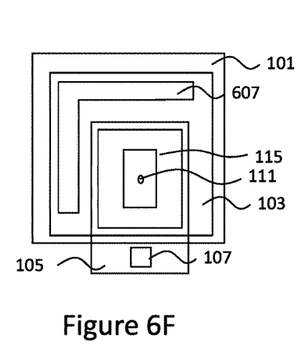

FIG. 6F illustrates an embodiment in which the, instead of using the first bottom contact 109, the second bottom contact 601, and the third bottom contact 603 separately, the first bottom contact 109 and the second bottom contact 601 are merged into a single L-shaped bottom contact 607. The single L-shaped bottom contact 607 may have the first thickness $T_1$, the ninth width $W_9$ and the ninth length $L_9$, although with only two legs instead of three.

Figure 7A:
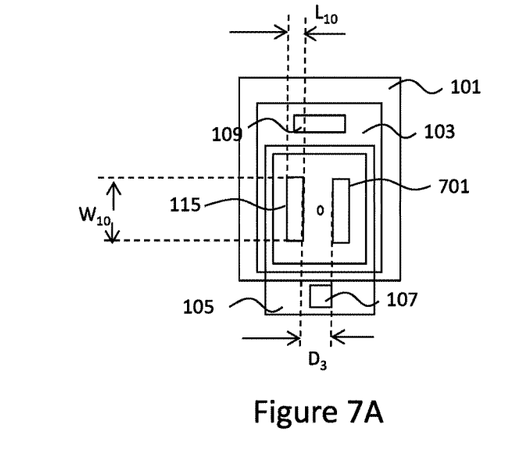
FIGS. 7A-7E illustrate embodiments that utilize one or more top contacts in accordance with some embodiments.

FIGS. 7A-7E illustrate embodiments which utilize one or more top contacts (e.g., the first top contact 115, a second top contact 701, a third top contact 703, a fourth top contact 705, or a fifth top contact 710). Looking first at FIG. 7A, FIG. 7A illustrates an embodiment which uses the first top contact 115 along with the second top contact 701, wherein both the first top contact 115 and the second top contact 701 have a longitudinal axis that is parallel with a line extending between the first gate contact 107 and the first bottom contact 109. In this embodiment the first top contact 115 and the second top contact 701 may each have a tenth length $L_{10}$ of between about 1 nanometer and about 10 micrometers, such as about 20 nanometers, and a tenth width $W_{10}$ of between about 1 nanometer and about 20 micrometers, such as about 72 nanometers. Additionally, the first top contact 115 and the second top contact 701 may be spaced from each other a third distance $D_3$ of less than about 10 micrometers, such as about 60 nanometers.

Figure 7B:
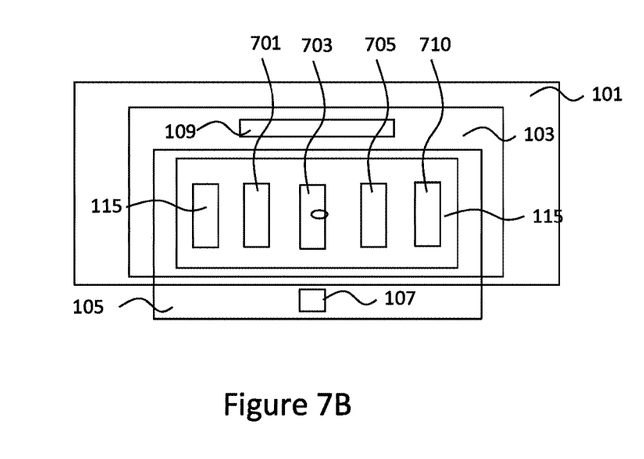

FIG. 7B illustrates a plurality of top contacts, such as the first top contact 115, the second top contact 701, the third top contact 703, the fourth top contact 705, and the fifth top contact 710. Each of these contacts may have similar dimensions, such as the tenth width $W_{10}$ and the tenth length $L_{10}$, and may be spaced apart from each other by the third distance $D_3$.

Figure 7C:
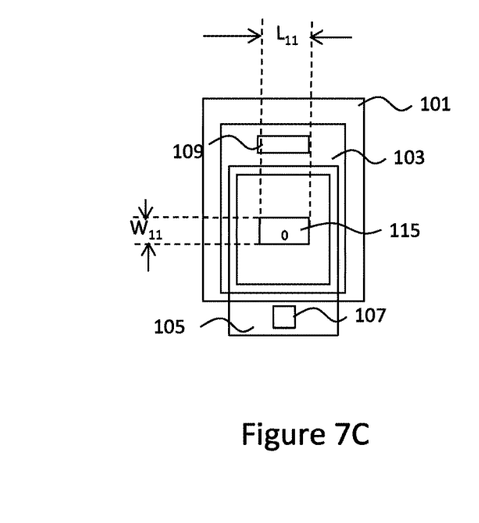

FIG. 7C illustrates an embodiment in which the first top contact 115, instead of having a longitudinal axis that is parallel to a line extending between the first gate contact 107 and the first bottom contact 109, has a longitudinal axis that is perpendicular with the line extending between the first gate contact 107 and the first bottom contact 109. In this embodiment the first top contact 115 may have an eleventh width $W_{11}$ of between about 1 nanometer and about 20 micrometers, such as about 20 nanometers, and an eleventh length $L_{11}$ of between about 1 nanometer and about 20 micrometers, such as about 40 nanometers.

Figure 7D:
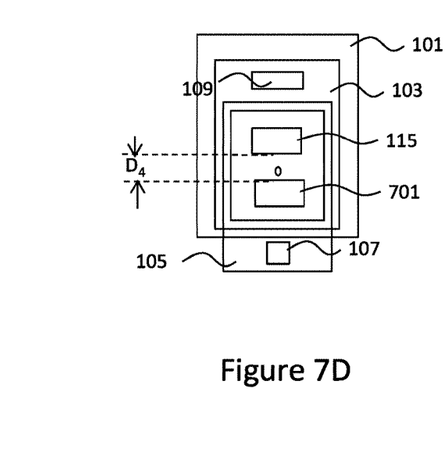

FIG. 7D illustrates an embodiment in which the first top contact 115 is oriented as described above with respect to FIG. 7C, and in which the second top contact 701 is additionally utilized. In this embodiment the second top contact 701 is oriented similar to the first top contact 115 (e.g., having a longitudinal axis perpendicular to the line extending between the first gate contact 107 and the first bottom contact 109). Additionally, the first top contact 115 and the second top contact 701 may be separated from each other by a fourth distance $D_4$ of less than about 20 micrometers, such as about 40 nanometers.

Figure 7E:
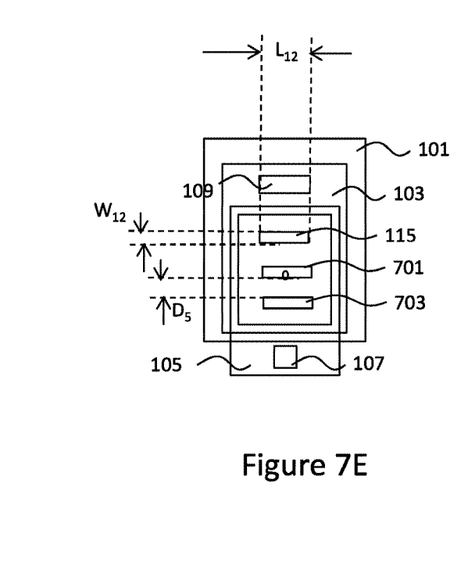

FIG. 7E illustrates an embodiment in which the third top contact 703 is utilized along with the second top contact 701 and the first top contact 115 wherein the third top contact 703 is oriented similar to the second top contact 701 (e.g., having a longitudinal axis parallel with a longitudinal axis of the first top contact 115). In this embodiment the first top contact 115, the second top contact 701, and the third top contact 703 are formed with a twelfth width $W_{12}$ of between about 1 nanometer and about 10 micrometers, such as about 20 nanometers, and a twelfth length $L_{12}$ of between about 1 nanometer and about 10 micrometers, such as about 240 nanometers. Additionally, the first top contact 115, the second top contact 701, and the third top contact 703 may be separated from each other by a fifth distance $D_5$ of less than about 20 micrometers, such as about 20 nanometers.

Figure 8A:
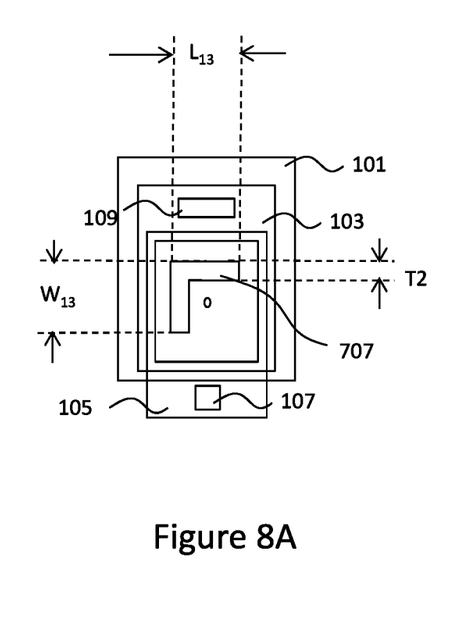
FIGS. 8A-8C illustrate embodiments that utilize a single top contact in accordance with some embodiments.
Figure 8B:
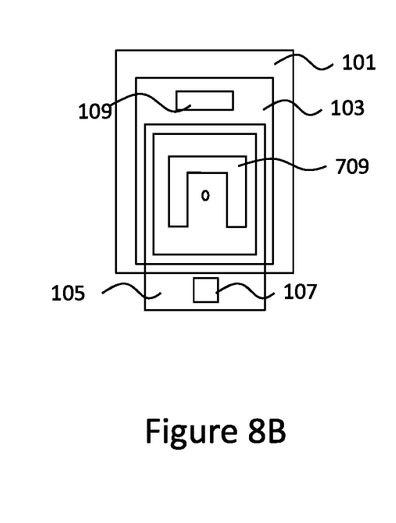
Figure 8C:
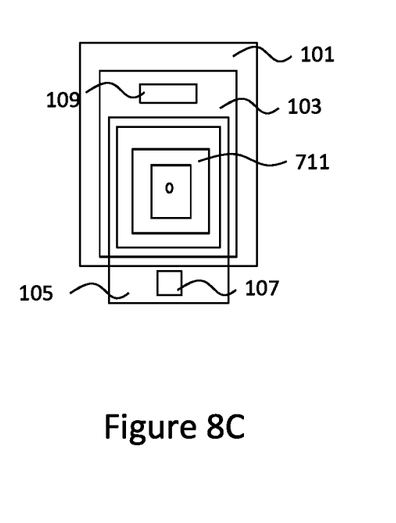

FIGS. 8A-8C illustrate embodiments that utilize a single top contact with differing shapes. FIG. 8A illustrates an embodiment in which a single L-shaped top contact 707 is utilized. In an embodiment the single L-shaped top contact 707 has a second thickness $T_2$ of between about 1 nanometer and about 20 micrometers, such as about 40 nanometers. Additionally, the single L-shaped top contact 707 may have a thirteenth width $W_{13}$ of between about 1 nanometer and about 20 micrometers, such as about 240 nanometers, and a thirteenth length $L_{13}$ of between about 1 nanometer and about 20 micrometers, such as about 240 nanometers.

FIG. 8B illustrates an embodiment in which a single U-shaped top contact 709 is utilized instead of the single L-shaped top contact 707 described above with respect to FIG. 8A. In an embodiment the single U-shaped contact 709 has the second thickness $T_2$, the thirteenth width $W_{13}$, and the thirteenth length $L_{13}$, although any suitable dimensions may alternatively be utilized.

FIG. 8C illustrates another embodiment which utilizes a single, squared shaped top contact 711 which, in the top down view of FIG. 8C, surrounds the first nanowire 111. In this embodiment the single, square shaped contact 711 has the second thickness $T_2$, the thirteenth width $W_{13}$, and the thirteenth length $L_{13}$, but has four sides instead of three sides (as in the embodiment illustrated in FIG. 8B) or two sides (as in the embodiments illustrated in FIG. 8A).

Figure 9A:
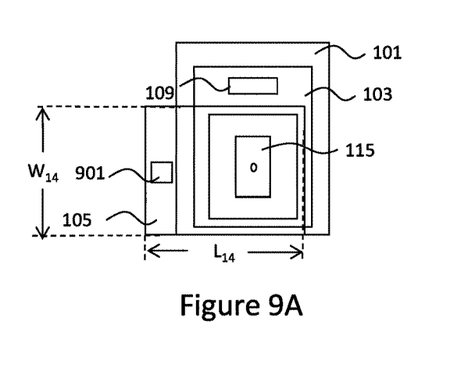
FIGS. 9A-9F illustrate embodiments that utilize one or more gate contacts in accordance with some embodiments.

FIG. 9A illustrates an embodiment in which one or more gate contacts (e.g., the first gate contact 107, a second gate contact 901, or a third gate contact 903) is utilized. In the embodiment illustrated in FIG. 9A, the second gate contact 901 may be similar to the first gate contact 107 (described above with respect to FIGS. 1A-1C). The second gate contact 901, however, is not aligned with the first top contact 115 and the first bottom contact 109 (as the first gate contact 107 is aligned in FIGS. 1A-1C), but is instead aligned along a line that is perpendicular to a line that runs through the first top contact 115 and the first bottom contact 109.

Additionally, in this embodiment the gate electrode 105 may be sized to accommodate the changed position of the second gate contact 901. In an embodiment the gate electrode 105 has a fourteenth width $W_{14}$ of between about 1 nanometer and about 20 micrometers, such as about 480 nanometers, and a fourteenth length $L_{14}$ of between about 1 nanometer and about 20 micrometers, such as about 450 nanometers. However, any suitable size may alternatively be utilized.

Figure 9B:
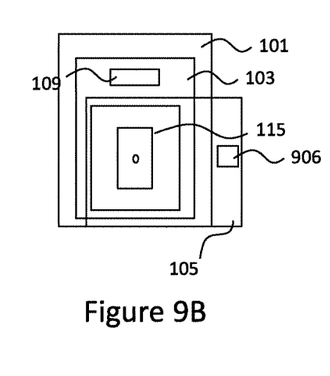

FIG. 9B illustrates an embodiment in which a third gate contact 903 is utilized. In an embodiment the third gate contact 903 may be similar to the second gate contact 901, although located on an opposite side of the first nanowire 111 than the second gate contact 901. In this embodiment the gate electrode 105 may have the fourteenth width $W_{14}$ and the fourteenth length $W_{14}$, although extending in an opposite direction than the embodiment illustrated in FIG. 9A.

Figure 9C:
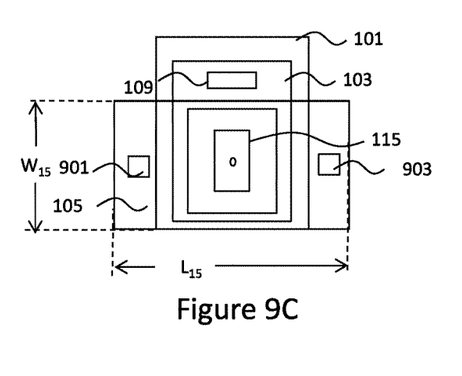

FIG. 9C illustrates an embodiment which utilizes the second gate contact 901 and the third gate contact 903. In an embodiment the second gate contact 901 is located as described above with respect to FIG. 9A and the third gate contact 903 is located as described above with respect to FIG. 9B. Additionally, in this embodiment the gate electrode 105 has a fifteenth width $W_{15}$ of between about 1 nanometer and about 20 micrometers, such as about 480 nanometers, and a fifteenth length $L_{15}$ of between about 3 nanometers and about 20 micrometers, such as about 600 nanometers.

Figure 9D:
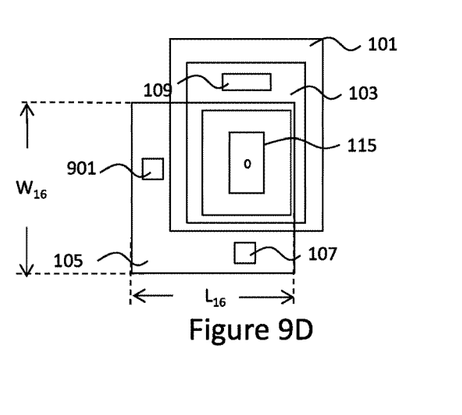

FIG. 9D illustrates another embodiment in which the first gate contact 107 is utilized with the second gate contact 901. In this embodiment the first gate contact 107 is located as described above with respect to FIGS. 1A-1C, and the second gate contact 901 is located as described above with respect to FIG. 9A. Additionally, in this embodiment the gate electrode 105 has a sixteenth width $W_{16}$ of between about 2 nanometers and about 20 micrometers, such as about 600 nanometers, and a sixteenth length $L_{16}$ of between about 2 nanometers and about 20 micrometers, such as about 600 nanometers.

Figure 9E:
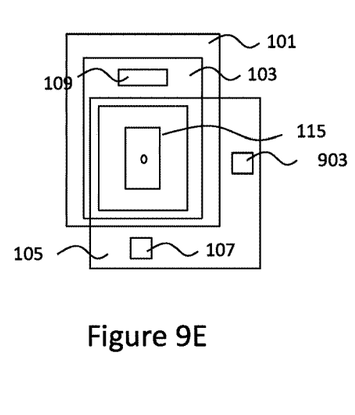

FIG. 9E illustrates an embodiment in which the first gate contact 107 is utilized with the third gate contact 903. In this embodiment the first gate contact 107 is located as described above with respect to FIGS. 1A-1C, and the third gate contact 903 is located as described above with respect to FIG. 9B. Additionally, in this embodiment the gate electrode 105 has the sixteenth width $W_{16}$ and the sixteenth length $L_{16}$.

Figure 9F:
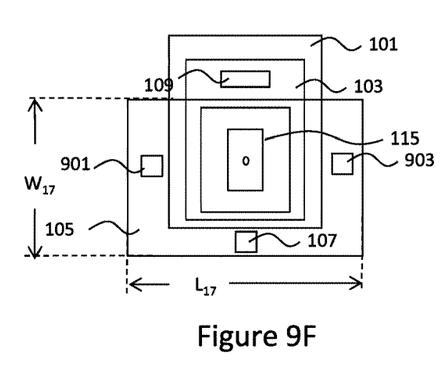

FIG. 9F illustrates an embodiment in which the first gate contact 107 is utilized with the second gate contact 901 and the third gate contact 903. In this embodiment the first gate contact 107 is located as described above with respect to FIGS. 1A-1C, the second gate contact 901 is located as described above with respect to FIG. 9A, and the third gate contact 903 is located as described above with respect to FIG. 9B. Additionally, in this embodiment the gate electrode 105 has a seventeenth width $W_{17}$ of between about 2 nanometers and about 20 micrometers, such as about 480 nanometers, and a seventeenth length $L_{17}$ of between about 3 nanometers and about 20 micrometers, such as about 600 nanometers.

Additionally, as one of ordinary skill in the art will understand, the embodiments described herein are not intended to be isolated from each other. Rather, any embodiment may be utilized with any other embodiment described herein. For example, the embodiments illustrated herein with multiple nanowires may be utilized with the embodiments illustrated herein with multiple bottom contacts and multiple top contacts. Any suitable combination may be utilized, and all such combinations are fully intended to be included within the scope of the embodiments.

By utilizing the above described embodiments, the VGAA transistor 100 may be formed to suit a wide variety of different applications while keeping variations within the VGAA transistor 100 to a minimum. As such, by reducing variations, the output may be better controlled, and an overall better product may be manufactured.

In accordance with an embodiment, a semiconductor device comprising a first nanowire over a substrate, the first nanowire being perpendicular to the substrate and comprising a first source/drain region, a channel region over the first source/drain region, and a second source/drain region over the channel region is provided. A first contact pad is at least partially surrounding the first source/drain region. A gate electrode is at least partially surrounding the channel region. A second contact pad is in electrical connection with the second source/drain region.

In accordance with another embodiment, a semiconductor device comprising a first contact pad on a substrate and a second contact pad over the first contact pad is provided. A first nanowire extends between the first contact pad and the second contact pad and a gate electrode is surrounding a channel region of the first nanowire.

In accordance with yet another embodiment a method of manufacturing a semiconductor device comprising forming a first nanowire from a substrate is provided. A first contact pad is formed adjacent to a lower portion of the first nanowire. A gate electrode is formed adjacent to a middle portion of the first nanowire, and a second contact pad is formed adjacent to an upper portion of the first nanowire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    patterning a photoresist over a semiconductor substrate;
    patterning the semiconductor substrate to form a first nanowire using the photoresist as a mask;
    depositing a first contact pad in physical contact with both the semiconductor substrate and the first nanowire, the first nanowire extending through the first contact pad, a bottommost surface of the first contact pad being level with a bottommost surface of the first nanowire, the bottommost surface of the first contact pad and the bottommost surface of the first nanowire facing the semiconductor substrate;
    forming a gate electrode around a channel region of the first nanowire after the depositing the first contact pad;
    forming a first dielectric layer over and in physical contact with the gate electrode, a topmost surface of the first dielectric layer being below a topmost surface of the first nanowire;
    forming a second dielectric layer over the first dielectric layer, the second dielectric layer being in physical contact with the gate electrode, a topmost surface of the second dielectric layer being level with the topmost surface of the first nanowire;
    forming a second contact pad over the first nanowire; and
    prior to the forming the gate electrode, forming a third dielectric layer, the forming the third dielectric layer comprising:
        depositing a dielectric material;
        performing a chemical mechanical planarization process; and
        etching back the dielectric material.

2. The method of claim 1, wherein the first nanowire has a width of between about 1 nanometer and about 100 nanometers.

3. The method of claim 2, wherein the first nanowire has a height of between about 1 nanometer and about 1 micrometer.

4. The method of claim 1, wherein the first contact pad has a width of between about 20 nanometers and about 20 micrometers.

5. The method of claim 4, wherein the first contact pad has a length of between about 9 nanometers and about 20 micrometers.

6. The method of claim 1, wherein the second contact pad has a width of between about 9 nanometers and about 20 micrometers and a length of between about 9 nanometers and about 20 micrometers.

7. A method of manufacturing a semiconductor device, the method comprising:
    removing a portion of a semiconductor substrate to form a nanowire;
    forming a first contact in physical connection with opposing portions of a sidewall of the nanowire and a remainder of the semiconductor substrate, a bottommost surface of the first contact being level with a bottommost surface of the nanowire, the bottommost surface of the first contact and the bottommost surface of the nanowire facing the remainder of the semiconductor substrate;
    depositing a gate dielectric adjacent to the nanowire after the forming the first contact;
    depositing a gate electrode adjacent to the gate dielectric after the depositing the gate dielectric;
    depositing a first dielectric layer over the gate electrode;
    depositing a second dielectric layer over the first dielectric layer, the second dielectric layer being different from the first dielectric layer, the second dielectric layer being in physical contact with the gate electrode, wherein after the depositing the second dielectric layer the second dielectric layer is part of a planar surface with the nanowire; and
    depositing a second contact in direct physical contact with the planar surface.

8. The method of claim 7, further comprising:
    forming a first contact plug to the first contact;
    forming a second contact plug to the gate electrode; and
    forming a third contact plug to the second contact at a same time as the forming the first contact plug and the forming the second contact plug.

9. The method of claim 8, wherein the first contact plug has a width of between about 1 nanometer and about 1 micrometer and a length of between about 1 nanometer and about 20 micrometers.

10. The method of claim 9, wherein the third contact plug has a width of between about 1 nanometer and about 20 micrometers and has a length of between about 1 nanometer and about 20 micrometers.

11. The method of claim 10, wherein the second contact plug has a width of between about 1 nanometer and about 20 micrometers and has a length of between about 1 nanometer and about 20 micrometers.

12. The method of claim 7, wherein the removing the portion of the semiconductor substrate forms an array of nanowires.

13. The method of claim 12, wherein rows within the array of nanowires have a first pitch of less than about 20 micrometers and wherein columns within the array of nanowires have a second pitch of less than about 20 micrometers.

14. The method of claim 7, further comprising, prior to the depositing the gate dielectric, forming a third dielectric layer, the forming the third dielectric layer comprising:
   depositing a dielectric material over the first contact and the nanowire;
   performing a planarization process to remove a portion of the dielectric material above the nanowire; and
   etching back the dielectric material below a topmost surface of the nanowire.

15. A method of manufacturing a semiconductor device, the method comprising:
   patterning a semiconductor material to form a first nanowire over a semiconductor substrate, the first nanowire being in direct physical connection with the semiconductor substrate, wherein the patterning the semiconductor material further forms a second nanowire and a third nanowire, wherein the first nanowire, the second nanowire, and the third nanowire are part of a first transistor, and wherein the first nanowire, the second nanowire, and the third nanowire are arranged in lines that are not parallel with exterior borders of the first transistor;
   implanting first ions into a first portion of the first nanowire to form a first source/drain region;
   forming a gate electrode adjacent to a second portion of the first nanowire to form a channel region;
   depositing a first dielectric layer around the gate electrode;
   implanting second ions into a third portion of the first nanowire to form a second source/drain region, wherein the implanting the second ions is performed after the depositing the first dielectric layer; and
   depositing a second dielectric layer around the second source/drain region after the implanting the second ions.

16. The method of claim 15, further comprising forming a contact over the first nanowire, the second nanowire, and the third nanowire.

17. The method of claim 16, wherein the second nanowire and the third nanowire are located on opposing sides of the contact, and are separated from each other by a distance of less than about 20 micrometers.

18. The method of claim 6, wherein the first nanowire, the second nanowire, and the third nanowire are fully covered by the contact.

19. The method of claim 15, wherein a topmost surface of the second dielectric layer is level with a topmost surface of the first nanowire.

20. The method of claim 15, further comprising forming a gate dielectric between the gate electrode and the second portion of the first nanowire.

* * * * *